United States Patent [19]
Takeshita et al.

[11] Patent Number: 4,460,912
[45] Date of Patent: Jul. 17, 1984

[54] SOLID STATE IMAGE SENSORS

[75] Inventors: Kaneyoshi Takeshita, Tokyo; Masaharu Hamasaki, Zama, both of Japan

[73] Assignee: Sony Corporation, Tokyo, Japan

[21] Appl. No.: 402,356

[22] Filed: Jul. 27, 1982

[30] Foreign Application Priority Data

Jul. 27, 1981 [JP] Japan .............................. 56-117302

[51] Int. Cl.³ ..................... H01L 29/78; H01L 27/14; H01L 31/00
[52] U.S. Cl. ........................................ 357/24; 357/30
[58] Field of Search ................ 357/24 M, 24 LR, 30

[56] References Cited

U.S. PATENT DOCUMENTS 3,896,474 7/1975 Amelio et al. ................. 357/24 LR
4,389,661 6/1983 Yamada .......................... 357/24 LR Primary Examiner—Gene M. Munson
Attorney, Agent, or Firm—Hill, Van Santen, Steadman & Simpson

[57] ABSTRACT

A solid state image sensor of the interline transfer type comprises a sensing and vertical transfer portion formed on a semiconductor substrate of a first conductive type, for example, P - type, a horizontal charge transfer portion and an output portion, wherein a semiconductor layer of a second conductive type, for example, N - type with the low impurity density is provided on the semiconductor substrate and a plurality of P - type semiconductor regions with the high impurity density, each of which contains a vertical charge transfer portion for vertically transferring a signal charge therein and an overflow drain for draining off a superfluous charge, both of which are provided in the form of N - type semiconductor areas apart from each other, and a plurality of photo-sensing areas for storing the signal charge produced in response to the light from the outside formed between each adjacent two of the P - type semiconductor regions are provided on the semiconductor layer of the N - type, so that no needless charge flows into the vertical charge transfer portion to be undesirably transferred therein.

5 Claims, 6 Drawing Figures

SOLID STATE IMAGE SENSORS

BACKGROUND OF THE INVENTION

1. Field of the Invention

This invention relates generally to solid state image sensors containing therein a portion forming a charge transfer device, and more particularly, is directed to improvements in such a solid state image sensor formed in the interline transfer type.

2. Description of the Prior Art

Solid state image sensors comprising a charge transfer device such as a charge coupled device (hereinafter referred to as a CCD) are classified broadly into the frame transfer type and the interline transfer type. Such solid state image sensors comprising the CCD have been given attention as devices able to realize a compact image pick up apparatus, namely, a television camera in miniaturized size operative with low power consumption and with high reliability. However, on the contrary to the above advantage, previously proposed solid state image sensors comprising the CCD have encountered with several problems as for the undesirable phenomena called "blooming" and "smear".

Considering the solid state image sensors of the interline transfer type, such a sensing device comprises a sensing and vertical transfer portion including a plurality of photo-sensing areas provided to make horizontal rows and vertical rows, vertical charge transfer portions provided along each of the vertical rows of the photo-sensing areas and transfer gate areas provided between each of the photo-sensing areas and the corresponding one of the vertical charge transfer portions, a horizontal charge transfer portion coupled with the vertical charge transfer portion and an output portion coupled with the horizontal charge transfer portion. The sensing and vertical transfer portions, horizontal charge transfer portions and output portions are formed on a common semiconductor substrate. The photo-sensing area is provided for producing a signal charge in response to the light received thereby and storing the signal charge therein. The transfer gate area is provided for transferring the signal charge stored in the photo-sensing area to the vertical charge transfer portion at each period corresponding to a vertical blanking period. The vertical charge transfer portion is provided for transferring the signal charge transferred from the photo-sensing area to the horizontal charge transfer portion in order at every period corresponding to a horizontal blanking period. The horizontal charge transfer portion is provided for transferring the signal charge transferred from the vertical charge transfer portion at each one of the periods corresponding to the horizontal blanking periods to the output portion during a period corresponding to a horizontal video period. Further, the output portion is provided for taking out an image pickup signal output in response to the signal charge transferred from the horizontal charge transfer portion.

In solid state image sensors of the interline transfer type using the CCD (hereinafter referred to as interline transfer CCD image sensors) previously proposed, when the light received by the photo-sensing area reaches to the inside of the semiconductor substrate placed under the photo-sensing area through the latter and a charge is produced thereby at the inside of the semiconductor substrate, such a charge partially flows into the vertical charge transfer portion undesirably without becoming the signal charge and is undesirably transferred by means of the charge transfer operation of the vertical charge transfer portion. This charge undesirably transferred becomes a noise component in the image pickup signal output derived from the sensor which causes an eyesore of white line on a picture obtained on an image display apparatus such as a picture tube in response to the image pickup signal output. Such phenomenon as to cause the eyesore of white line on the picture is called "smear" and one of the unsolved problems encountered with the previously proposed interline transfer CCD image sensors.

SUMMARY OF THE INVENTION

Accordingly, it is an object of the present invention to provide a solid state image sensor of the interline transfer type which is improved to avoid the above mentioned problem encountered with the prior art.

Another object of the present invention is to provide a solid state image sensor of the interline transfer type which is improved in its structure so as not to induce a charge flowing into a vertical charge transfer portion from a semiconductor substrate provided therein and being undesirably transferred in the vertical charge transfer portion.

A further object of the present invention is to provide an improved solid state image sensor, wherein a photo-sensing area formed on a semiconductor substrate is contiguous to a first conductive type semiconductor region with low impurity density and a second conductive type semiconductor region with high impurity density each provided in the semiconductor substrate, and a vertical charge transfer portion also formed on the semiconductor substrate is wrapped by the second conductive type semiconductor region, so that a charge produced at the inside of the semiconductor substrate is prevented from flowing into the vertical charge transfer portion.

Other objects, advantages and features of the present invention will become apparent from the following description of preferred embodiments taken in conjunction with the accompanying drawings.

DESCRIPTION OF THE PREFERRED EMBODIMENTS

Figure 1:
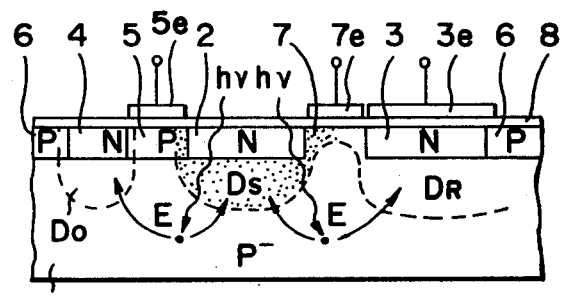
FIG. 1 is a sectional view showing a part of a previously proposed interline transfer CCD image sensor.

First, to assist understanding of the embodiments, a part of a previously proposed interline transfer CCD image sensor will be explained with reference to FIG. 1. In FIG. 1, a sensing and vertical transfer portion of the previously proposed interline transfer CCD image sensor is shown. The sensing and vertical transfer portion containing a plurality of sensing element units is formed on a P-type semiconductor substrate 1. In each of the sensing elements units on the semiconductor substrate 1, a photo-sensing area 2, a vertical charge transfer portion 3 and an overflow drain 4 for draining a superfluous charge from the photo-sensing area 2 are provided in the form of N-type semiconductor regions, and an overflow control gate area 5 for forming a potential barrier between the photo-sensing area 2 and the overflow drain 4 and a channel stop area 6 for separating the sensing element units from each other are provided in the form of P-type semiconductor regions with high impurity density. And then an upper portion of the P-type semiconductor substrate 1 positioned between the photo-sensing area 2 and the vertical charge transfer portion 3 forms a transfer gate area 7.

Further, an insulating layer 8 is provided on the whole of the above mentioned various parts. On the insulating layer 8, a vertical transfer electrode 3e, an overflow control gate electrode 5e and a transfer gate electrode 7e are provided over the vertical charge transfer portion 3, the overflow control gate area 5 and the transfer gate area 7, respectively, and an appropriate vertical transfer clock signal and bias voltages are supplied to these electrodes.

With the above mentioned construction, during a light receiving period in which the photo-sensing area 2 receives the light to produce and store a signal charge therein and the vertical charge transfer portion 3 vertically transfers the signal charge already transferred from the photo-sensing area 2 at every period corresponding to the horizontal blanking period, depleted areas come into existence as shown with the broken lines partitioning them in FIG. 1, wherein a depleted area Ds (shown as dotted), a depleted area Dr and a depleted area Do are caused by the photo-sensing area 2, the vertical charge transfer portion 3 and the overflow drain 4, respectively. In this condition, a charge produced in the depleted area Ds by the photo-electric converting operation therein for the light received by the photo-sensing area 2 is collected into the photo-sensing area 2 by the electric field existing in the depleted area Ds to become the signal charge. However, a charge E also produced in the P-type semiconductor substrate 1 by the photo-electric converting operation therein for a light hv which is a part of the light received by the photo-sensing area 2 and reaches to the inside of the P-type semiconductor substrate 1 through the depleted area Ds, partially enters into the photo-sensing area 2 to become the signal charge and then partially flows into the depleted areas Dr and De so as to be collected into the vertical charge transfer portion 3 and the overflow drain 4 by the electric fields existing in the depleted areas Dr and Do, respectively. Although a part of the charge E collected into the overflow drain 4 is drained to the outside of the sensing and vertical transfer portion without any trouble, another part of the charge E collected into the vertical charge transfer portion 3 becomes a needless charge undesirably transferred to the horizontal charge transfer portion by means of the charge transfer opretion of the vertical charge transfer portion 3. Such a needless charge induces the noise component in the image pickup signal output derived from the sensor, which causes the undesirable phenomenon called "smear", so that the image pickup signal output is deteriorated in quality.

Now, an embodiment of solid state image sensor of the interline transfer type according to the present invention will be explained with reference to FIGS. 2 and 3.

Figure 2:
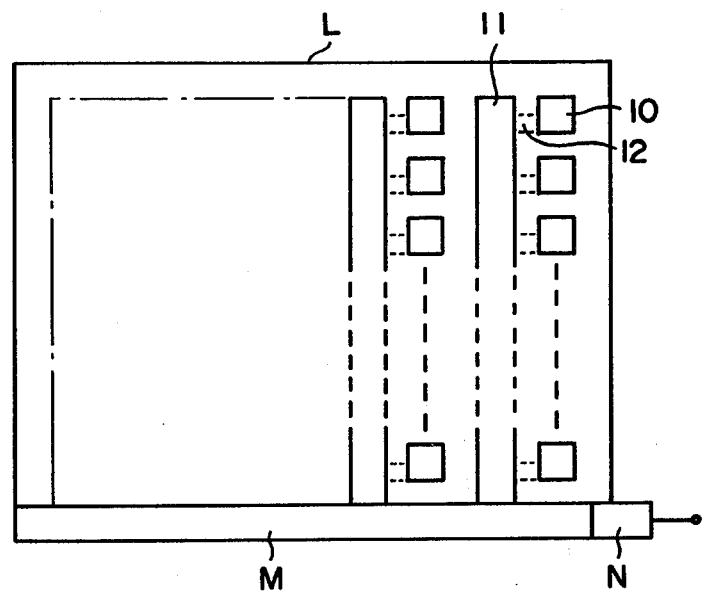
FIG. 2 is a schematic plane view showing one embodiment of solid state image sensor according to the present invention.

As shown in FIG. 2, an example of the solid state image sensor of the interline transfer type according to the present invention comprises a sensing and vertical transfer portion L including a plurality of photo-sensing areas 10 provided to make horizontal rows and vertical rows, vertical charge transfer portions 11 provided along each of the vertical rows of the photo-sensing areas 10 and transfer gate areas 12 provided between each of the photo-sensing areas 10 and the corresponding one of the vertical charge transfer portions 11, a horizontal charge transfer portion M coupled with the sensing and vertical transfer portion L and an output portion N coupled with the horizontal charge transfer portion M, basically in the manner similar to the prior art. The solid state image sensor according to the present invention is characterized by the novel structure and operation of the sensing and vertical transfer portion L therein.

Figure 3:
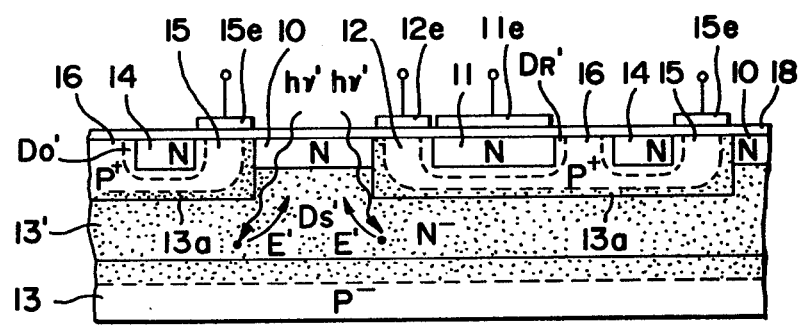
FIG. 3 is a sectional view showing a part of one example of a solid state image sensor according to the present invention.

FIG. 3 shows a partial section of the sensing and vertical transfer portion L of the example of the solid state image sensor according to the present invention. The sensing and vertical transfer portion L is formed on a first type, for example, P-type semiconductor substrate 13 in which a second type, for example, N-type semiconductor layer 13' with the low impurity density is provided, and contains a plurality of sensing element units. On the N-type semiconductor layer 13', plural P-type semiconductor regions 13a with the high impurity density are provided. Further, the photo-sensing area 10 is provided between each adjacent two of the P-type semiconductor regions 13a on the N-type type semiconductor layer 13'. Each pair of one of the P-type semiconductor regions 13a and one of the photo-sensing areas 10 forms each of the sensing element units.

In the P-type semiconductor region 13a, the vertical charge transfer portion 11 and a overflow drain 14 for draining off a superfluous charge from the photo-sensing area 10 are provided in the form of N-type semiconductor areas apart from each other, so that the P-type semiconductor region 13a wraps both of the vertical charge transfer portion 11 and the overflow drain 14 separately. A first part of the P-type semiconductor region 13a positioned between the photo-sensing area 10 and the overflow drain 14 forms an overflow control gate area 15 for forming a potential barrier for the overflow drain 14. A second part of the P-type semiconductor region 13a positioned between the vertical charge transfer portion 11 and the overflow drain 14 forms a channel stop area 16 for separating the sensing element units from each other. A third part of the P-type semiconductor region 13a positioned between the photo-sensing 10 area and the vertical charge transfer portion 11 forms the transfer gate area 12.

Further, an insulating layer 18 is provided on the above mentioned various parts forming each of the sensing element units. On the insulating layer 18, a vertical transfer electrode 11e, a transfer gate electrode 12e and an overflow control gate electrode 15e are provided over the vertical charge transfer portion 11, the transfer gate area 12 and the overflow control gate area 15, respectively, and an appropriate vertical transfer clock signal and bias voltages are supplied to these electrodes.

With the above mentioned construction, during a light receiving period in which the photo-sensing area 10 receives the light to produce and store a signal charge therein and the vertical charge transfer portion 11 vertically transfers the signal charge already transferred from the photo-sensing area 10 at every period corresponding to the horizontal blanking period, depleted areas Ds′, Dr′ and Do′ come into existence as shown with the broken lines partitioning them in FIG. 3. The depleted area Ds′ (shown as dotted) is caused by the photo-sensing area 10 so as to extend over the whole N-type semiconductor layer 13′ with the low impurity density and besides to enter into the P-type semiconductor regions 13a with the high impurity density and the P-type semiconductor substrate 13 along both interfaces between the N-type semiconductor layer 13′ and the P-type semiconductor regions 13a and between the N-type semiconductor layer 13′ and the P-type semiconductor substrate 13. The depleted area Dr′ is caused by the vertical charge transfer portion 11 so as to wrap the latter in the P-type semiconductor region 13a, and further the depleted area Do′ is caused by the overflow drain 14 so as to wrap the latter in the P-type semiconductor region 13a.

Hereon, what is noteworthy is that the N-type semiconductor region 13′ with the low impurity density is provided to allow the depleted area Ds′ caused by the photo-sensing area 10 to extend over there, so that the depleted area Ds′ dominated by the potential of the photo-sensing area 10 extends broadly under the photo-sensing area 10, and the vertical charge transfer portion 11 and the overflow drain 14 are wrapped with the P-type semiconductor region 13a with the high impurity density separately so as to be isolated from each other.

In this condition, the photo-electric conversion for almost all of the light $h_\nu'$ received by the photo-sensing area 10, except a little part of the light $h_\nu'$ passing through the N-type semiconductor layer 13′ to reach to the P-type semiconductor substrate 13, is performed in the depleted area Ds′. Substantially all of a charge E′ produced in the depleted area Ds′ by the photo-electric converting operation therein is collected into the photo-sensing area 10 by the electric field having the potential inclination toward the photo-sensing area 10 in the depleted area Ds′ to become the signal charge and no charge flows into the vertical charge transfer portion 11 or the overflow drain 14 through the depleted area Dr′ caused by the vertical charge transfer portion 11 or the depleted area Do′ caused by the overflow drain 14. Further, a charge produced in a neutral area at the outside of the depleted area Ds′ in the P-type semiconductor substrate 13 by the photo-electric converting operation therein for the little part of the light $h_\nu'$ does not enter into the deoleted area Dr′ and Do′, but enter into the depleted area Ds′ and then is collacted into the photo-sensing area 10. Accordingly, no needless charge flows into the vertical charge transfer portion 11 to be transferred therein and therefore the undesirable phenomenon called "smear" is not caused. Further, in this case, since the depleted area Ds′ caused by the photo-sensing area 10 is extended quite broadly and deeply in the N-type semiconductor layer 13′, the efficiency in utilization of the charge, which is produced by the photo-electric conversion for the light received by the photo-sensing area 10, as the signal charge is so improved.

Figure 4A:
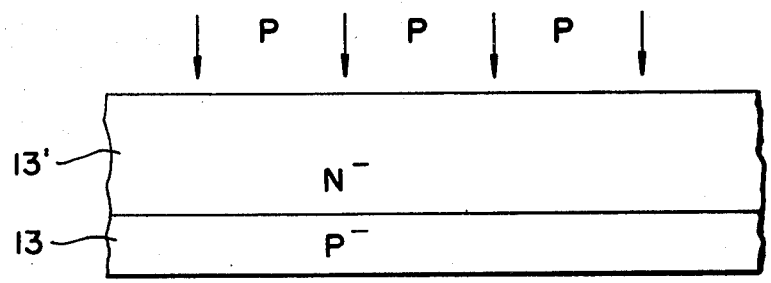
FIGS. 4A, 4B and 4C are illustrations used for explanation of one example of the process for producing a solid state image sensor according to the present invention having such a part as shown in FIG. 2.

Next, an example of the manufacturing process for producing the solid state image sensor according to the present invention having the sensing and vertical transfer portion as shown in FIG. 3 will be explained with reference to FIGS. 4A, 4B and 4C. In the process, first, as shown in FIG. 4A, phosphorus ions(P), for example, are doped into the P-type semiconductor substrate 13, the impurity density of which is, for example, about $5 \times 10^{14}$ cm$^{-3}$, from its one surface by means of ion implantation with such low ion density that the dose quantity is, for example, about $2.5 \times 10^{12}$ cm$^{-2}$ and diffused by means of heating for long time in the condition of high temperature, so that the N-type semiconductor layer 13′, the impurity density of which is, for example, about $10^{15}$ cm$^{-3}$, is formed. The thickness of the N-type semiconductor layer 13′ is determined to be, for example, about 2.5 μm.

Figure 4B:
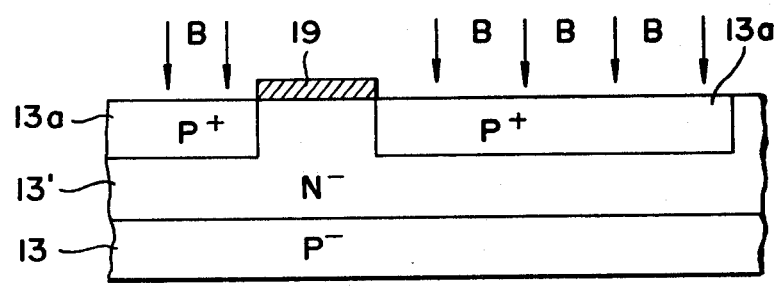

Then, as shown in FIG. 4B, a mask 19 is provided at the position whereat the photo-sensing area is to be provided on the upper surface of the N-type semiconductor layer 13′ and boron ions(B), for example, are doped into the N-type semiconductor layer 13′ from a portion of its surface where the mask 19 is not provided by means of ion implantation which such ion density that the dose quantity is, for example, about $3.15 \times 10^{12}$ cm$^{-2}$ and diffused to the depth of, for example, about 1.5 μm, so that the P-type semiconductor regions 13a are formed with the high impurity density of, for example, about $2 \times 10^{16}$ cm$^{-3}$.

Figure 4C:
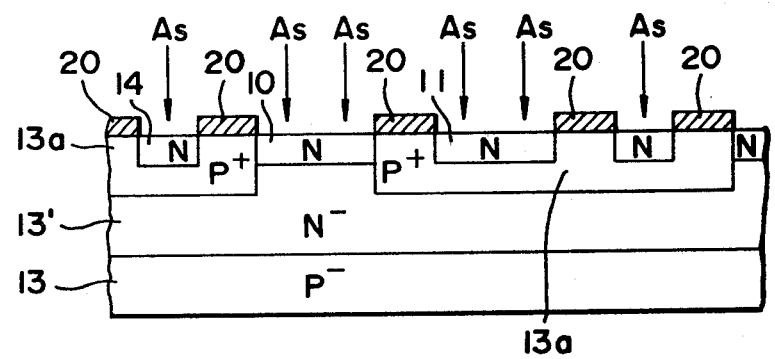

Further, as shown in FIG. 4C, masks 20 are provided on the upper surface of the P-type semiconductor regions 13a except the positions whereat the vertical charge transfer portion and the overflow drain are to be provided and after the maks 19 on the surface of the N-type semiconductor layer 13′ is removed, arsenic ions(As), for example, are doped into both of the N-type semiconductor layer 13′ and the P-type semiconductor region 11a from positions where the masks 20 are not provided by means of ion implantation with such ion density that dose quantity is, for example, about $4 \times 10^{12}$ cm$^{-2}$ and diffused to the depth of, for example, about 0.5 μm, so that the photo-sensing area 10, the vertical charge transfer portion 11 and the overflow drain 14 are provided in the form of the N-type semiconductor areas, the impurity dencity of each of which is, for example, about $6 \times 10^{16}$ cm$^{-3}$.

After that, the masks 20 are removed and the insulating layer 18 is provided on the above mentioned various areas and portions, and then the vertical transfer electrode 11e, the transfer gate electrode 12e, the overflow control gate electrode 15e and so on are provided on the insulating layer 18, so that the construction as shown in FIG. 3 is obtained.

In the above embodiment, the overflow drain and overflow control gate area are provided to drain off the superfluous charge from the photo-sensing area, and consequently, the undesirable phenomenon called "blooming" is surely suppressed. However, since the overflow drain and the overflow control gate area are placed in the sensing element unit of a limited area together with the photo-sensing area and the vertical charge transfer portion, the surface area of the photo-sensing area or the vertical charge transfer portion is reduced.

Accordingly, in view of this, it is desirable for the construction shown in FIG. 3 that the overflow drain 14, a part of the P-type semiconductor region 13a positioned under the overflow drain 14 and the overflow control gate area 15 are made in the form of such thin areas that the light entering thereinto can pass through to the N-type semiconductor layer 13′ with little absorption thereby, so that the substantial photo-sensing area is enlarged. In this case, the light which is received by the overflow drain 14 and the overflow control gate area 15 reaches to the depleted area Ds' extended in the N-type semiconductor layer 13' through the overflow drain 14 and the overflow control gate area 15 and prodeces a charge in accordance with the photo-electric conversion therein. This charge produced in the depleted area Ds' is also collected into the photo-sensing area 10 in addition to the charge produced in response to the light received by the photo-sensing area 10 and becomes a part of the signal charge. This results in that the photo-sensing area is substantially enlarged to be compensated for the reduction of its surface area caused by the overflow drain and the overflow control gate area, and photo-sensitivity is improved.

In order to obtain such a thin overflow drain and overflow control gate area as mentioned above, the following is proposed herein. With the manufacturing process explained above with reference to FIGS. 4A, 4B and 4C, the P-type semiconductor regions 13a are formed into thin areas with the thickness of, for example, about 0.5 μm in the step shown in FIG. 4B and the photo-sensing area 10, the vertical charge transfer portion 11 and the overflow drain 14, which are provided in the form of the N-type semiconductor areas, are also formed into thin areas with the thickness of, for example, about 0.2 μm in the step shown in FIG. 4C. After that, masks are provided on the overflow drain 14 and a part of the N-type semiconductor region 13a where forms the overflow control gate area 15, and boron ions and arsenic ions are diffused in the P-type semiconductor region 13a and the N-type semiconductor areas forming the photo-sensing area 10 and the vertical charge transfer portion 11, respectively, through the surface portions whereat the masks are not provided. With this diffusion, the photo-sensing area 10, the vertical charge transfer portion 11 and the P-type semiconductor region 13a except the part thereof where forms the overflow control gate area 15 are reformed into thick areas in comparison with the overflow drain 14 and the part of the P-type semiconductor region 13a where forms the overflow control gate area 15. As a result of this, both the overflow drain 14 and the overflow control gate area 15 are obtained in the form of thin areas.

As apparent from the above explanation of the embodiments, in the solid state image sensor according to the present invention, since a charge other than the signal charge stored in the photo-sensing area does not flow into the vertical charge transfer portion to be transferred therein, a image pickup signal output with high quality which does not induce the undesirable phenomenon called "smear" on a picture reproduced in response to the image pickup signal output can be obtained from the output portion. Moreover, in the solid state image sensor according to the present invention, since the photo-sensing area is substantially extended, the efficiency in utilization of the charge, which is produced by the photo-electric conversion for the light received by the sensor, as the signal charge is so increased and therefore the improved photo-sensitivity can be obtained, and further, it is possible to minimize the photo-sensing area so that the whole size of the sensor can be miniaturized or the image resolvability of the sensor can be improved by means of increment of the number of the sensing element regions.

Incidentally, the present invention should not restricted within the scope of the above described embodiments having the sensing and vertical transfer portion as shown in FIGS. 2 and 3 but can be affected with variations and modifications without departing from the spirit and scope of the novel concept of the disclosure.

What we claim is:

1. A solid state image sensor comprising:
   a sensing and vertical transfer portion formed on a semiconductor substrate of a first conductive type, wherein a semiconductor layer of a second conductive type with low impurity density, a plurality of semiconductor regions of the first conductive type formed in said semiconductor layer of the second conductive type and a plurality of photo-sensing areas for storing a signal charge produced in response to the light from the outside formed between each adjacent two of said semiconductor regions of the first conductive type are provided, each of said semiconductor regions of the first conductive type containing a vertical charge transfer portion for vertically transferring signal charge transferred from said photo-sensing area and an overflow drain for draining off a superfluous charge from said photo-sensing area, both of which are provided in the form of semiconductor areas of the second conductive type apart from each other therein;
   a horizontal charge transfer portion for horizontally transferring the signal charge transferred from said sensing and vertical transfer portion; and an output portion for taking out an image pickup signal output in response to the signal charge transferred from said horizontal charge transfer portion.

2. A solid state image sensor comprising a semiconductor substrate of a first conductivity type, a first semiconductor region of a second conductivity type and low impurity concentration formed in said substrate, a second plurality of separated semiconductor regions of said first conductivity type formed in said first semiconductor region, a third plurality of photo-sensing areas of said second conductivity type between said second plurality of semiconductor regions, a fourth plurality of vertical charge transfer regions of said second conductivity type with one such region in each of said second semiconductor regions, a fifth plurality of overflow drain regions of said second conductivity type with one such region in each of said second semiconductor regions and transfer gate electrodes, overflow drain electrodes and vertical charge transfer electrodes respectively formed on said second plurality of semiconductor regions and over said vertical charge transfer regions.

3. A solid state image sensor according to claim 2 wherein an insulating layer is formed under said transfer gate electrodes, overflow drain electrodes and said charge transfer electrodes.

4. A solid state image sensor according to claim 3, wherein said transfer gate electrode and said overflow gate electrode are separated by said vertical charge transfer electrode.

5. A solid state image sensor according to claim 4, including a channel stopper portion of each of said second plurality of semiconductor regions formed between said fourth vertical charge transfer regions and said fifth overflow drain regions.

\* \* \* \* \*